United States Patent
Carson et al.

[19]

[11] Patent Number: 6,137,690
[45] Date of Patent: Oct. 24, 2000

[54] ELECTRONIC ASSEMBLY

[75] Inventors: Robert Thomas Carson, Lantana; Arnold William Hogrefe, Boynton Beach, both of Fla.; Frank Juskey, Chandler, Ariz.

[73] Assignee: Motorola, Schaumburg, Ill.

[21] Appl. No.: 08/916,714

[22] Filed: Aug. 18, 1997

[51] Int. Cl.[7] .................................................. H05K 1/18
[52] U.S. Cl. .................... 361/779; 361/702; 361/749; 361/760; 361/762; 361/765; 361/777; 361/743; 257/737; 257/692; 257/292; 228/123.1; 228/180.21; 228/180.22
[58] Field of Search ..................................... 361/779, 702, 361/749, 760, 762, 765, 777, 743; 257/737, 692, 292; 228/123.1, 180.22, 180.21

[56] References Cited

U.S. PATENT DOCUMENTS

| 4,706,870 | 11/1987 | Legge | 228/123.1 |
| 4,922,322 | 5/1990 | Mathew | 257/737 |
| 5,208,186 | 5/1993 | Mathew | 438/614 |
| 5,268,819 | 12/1993 | Lonka | 361/785 |
| 5,535,101 | 7/1996 | Miles et al. | 367/808 |
| 5,551,627 | 9/1996 | Leicht et al. | 228/180.22 |
| 5,573,171 | 11/1996 | Kong et al. | 228/123.1 |
| 5,768,109 | 6/1998 | Gulick et al. | 361/794 |

*Primary Examiner*—Leo P. Picard
*Assistant Examiner*—David Foster
*Attorney, Agent, or Firm*—Philip P. Macnak

[57] ABSTRACT

An electronic assembly (10) comprises one or more electronic components (18) having solder terminations (20), and a printed circuit substrate (12) having printed circuit traces (14, 16), wherein at least one of the solder terminations of the one or more electronic components (18) and the printed circuit traces (14, 16) of the printed circuit substrate (12) has a secondary finish produced by application of an electrolessly deposited nickel film (26) containing phosphorus which is further plated with gold (28). An indium-tin-lead solder paste (22) is utilized in a soldering process to attached the one or more electronics components (18) to the printed circuit traces (14,16) on the printed circuit board (12), such that the indium-tin-lead solder (22) provides improved solder joint integrity with the secondary finish. The electronic components (18) include semiconductor devices such as ball grid arrays (1000) and flip-chip integrated circuits (1010).

23 Claims, 7 Drawing Sheets

SECTION 11-11

SECTION 13-13

ELECTRONIC ASSEMBLY

FIELD OF THE INVENTION

The present invention relates generally to electronic assemblies, and more particularly to electronic assemblies which utilize nickel-gold finishes and a solder which includes indium as a constituent.

BACKGROUND OF THE INVENTION

Electronic devices, such as pagers, cellular telephones, cordless telephones, and personal digital assistants (PDAs) just to name a few, have seen significant reduction in size due to the use of leadless components and improving reflow solder technologies. Such electronic devices typically utilize glass epoxy printed circuit boards upon which printed circuit patterns have been formed using conventional photolithographic processes and additive plating or etching processes. The printed circuit patterns are typically a one ounce copper plating, which after processing, is protected from oxidation using an organic solder preservative or tin-lead plating which has been leveled by an air-knife process. While both methods of protecting the copper from oxidation to guarantee subsequent solderability have generally proved satisfactory, the organic solder preservative is less costly to produce, but unfortunately provides little, if any post-solder protection, and the printed circuit board patterns of electronic assemblies often exhibit corrosion problems when subjected to moisture or humidity. Corrosion of the printed circuit pattern is especially troublesome at the connections of heat seal connectors such as used to interconnect liquid crystal displays to the copper printed circuit board runners.

The humidity problem can be resolved by the use of an electroless nickel-gold plating process, but such a plating process has proven to be less than satisfactory for widespread use due to embrittlement of component solder joints as compared to conventional reflow soldering of components to bare copper. As a result, the use of printed circuit boards plated using an electroless nickel-gold plating process has been limited to a very small percentage of the printed circuit boards manufactured. Joint embrittlement has been generally attributed to phosphorus buildup at the solder joint and the nature of the intermetallic formed at the joint during the reflow solder process. Such joint degradation has been limited to some extent by increasing solder pad sizes and the use of relatively high volumes of solder at the joint, both of which are contrary for the production of compact electronic circuits which are capable of tolerating high levels of mechanical shock.

What is needed is a solder for use in a soldering process which can overcome the joint embrittlement problem created in an electronic assembly which utilizes a nickel-gold finish.

SUMMARY OF THE INVENTION

In accordance with a first aspect of the present invention, an electronic assembly comprises one or more electronic components having solder terminations and a printed circuit substrate having printed circuit traces, wherein at least one of the solder terminations of the one or more electronic components and the printed circuit traces of the printed circuit substrate has a secondary finish produced by the application of an electrolessly deposited nickel film containing phosphorus which is further plated with gold. A solder which includes indium as a constituent is utilized to attached the one or more electronics components to the printed circuit traces on the printed circuit substrate, wherein the solder which includes indium as a constituent provides improved solder joint integrity with the secondary finish.

In accordance with a second aspect of the present invention, an electronic assembly comprises a semiconductor device having solder terminations and a printed circuit substrate having printed circuit traces, wherein at least one of the solder terminations of the semiconductor device and the printed circuit traces of the printed circuit substrate has a secondary finish produced by the application of an electrolessly deposited nickel film containing phosphorus which is further plated with gold. A solder which includes indium as a constituent is utilized to attached the one or more electronics components to the printed circuit traces on the printed circuit substrate, wherein the solder which includes indium as a constituent provides improved solder joint integrity with the secondary finish.

In accordance with a third aspect of the present invention, an electronic assembly comprises one or more electronic components having solder terminations and a printed circuit substrate having printed circuit traces, wherein at least one of the solder terminations of the one or more electronic components and the printed circuit traces of the printed circuit substrate has a secondary finish produced by the application of an electrolessly deposited nickel film containing phosphorus which is further plated with gold. A solder which includes a metal which interacts with phosphorus as a constituent is utilized to attached the one or more electronics components to the printed circuit traces on the printed circuit substrate, wherein the solder which includes indium as a constituent provides improved solder joint integrity with the secondary finish.

DESCRIPTION OF THE PREFERRED EMBODIMENTS

Figure 1:
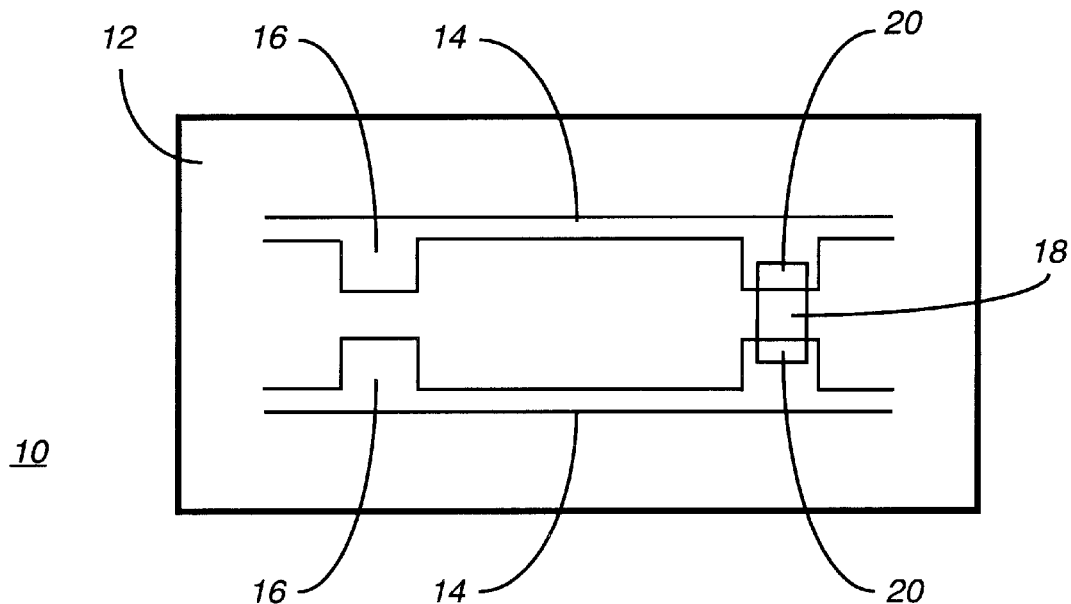
FIG. 1 is a plan view of a portion of an electronic assembly utilizing a conventional soldering process.
Figure 2:
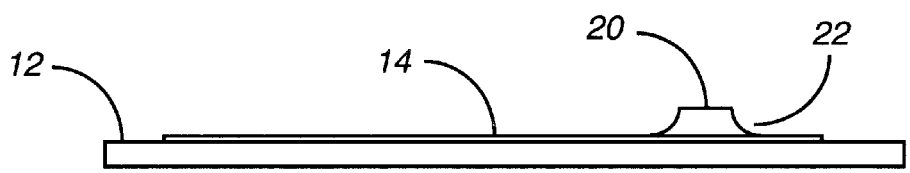
FIG. 2 is a side view of the portion of the electronic assembly utilizing the conventional soldering process.

FIG. 1 is a plan view of a portion of an electronic assembly 10 utilizing a conventional reflow soldering process. The electronic assembly can represent any electronic device, such as a pager, cellular telephone, cordless telephone, or personal digital assistants (PDAs) which has been assembled using a conventional reflow soldering process. The portion of the electronic assembly 10 illustrates printed circuit traces 14 which includes solder pads 16 which have been formed on a printed circuit substrate 12. The printed circuit substrate can utilize any of a number of well known substrate materials, such as a glass epoxy laminate or a flexible substrate, such as a polyimide film. An electronic component 18 having terminations 20 is attached to the solder pads 16 using a solder paste and a conventional reflow soldering process. The electronic component 18 can be a leadless capacitor, resistor, inductor or other leadless or leaded surface mount electrical component. Referring to FIG. 2 which is a side view of the portion of the electronic assembly 10, during the reflow soldering process, a solder fillet 22 is formed which provides both an electrical connection and mechanical attachment of the electronic component 20 to the printed circuit traces 14.

As previously described above, the printed circuit pattern can be formed using conventional photolithographic processes and additive plating or subtractive etching processes. The printed circuit traces 14 are typically a one ounce copper plating, which after processing are generally protected from oxidation using an organic solder preservative. As also described above, the organic solder preservative functions very well to inhibit oxidation of the copper printed circuit pattern, thereby insuring reliable solder joints are formed using a conventional reflow solder process, and a standard solder paste, such as an SN62 solder paste manufactured by Indium Corporation of Utica, N.Y., which has a composition of 62% tin, 2% Silver and 36% lead. Solder joint integrity to the bare copper runners has proven to be very good. The problem with the use of an organic solder preservative is that of corrosion of the copper printed circuit pattern due to moisture and humidity, which can lead to long term reliability problems within the electronic device.

Figure 3:
FIG. 3 is a cross-sectional view of a secondary finish utilizing nickel-gold.

Secondary finishes have been developed which can effectively prevent corrosion of the copper printed circuit pattern. One such secondary finish is illustrated in FIG. 3 which is a cross-sectional view of a nickel-gold finish. Following the formation of the printed circuit traces 14, the printed circuit substrate 12 is immersed into a nickel plating bath. An auto-catalytic reaction occurs in the nickel plating bath depositing a nickel layer 26 on the bare copper runners 24. The nickel layer 26 also includes phosphorus, the relative level of phosphorus being plated out is controlled to a certain extent by controlling the pH of the plating batch. After nickel plating, a gold layer 28 is formed using an immersion gold plating process. In the immersion gold plating process, nickel at the surface is replaced by gold, and once all the surface nickel has been replaced by gold, the plating process stops.

The nickel-gold secondary finish provides superior corrosion resistance as compared to the organic solder preservative, however, it has been found to produce significantly weaker solder joints when a conventional tin-lead solder paste is used, and compared to the solder joint obtained using the conventional tin-lead solder paste and a bare copper pattern. As described above, the joint embrittlement which results has significantly limited the acceptance of nickel-gold secondary finished printed circuit boards to those electronic device which are not subject to any substantial levels of mechanical shock.

Figure 4:
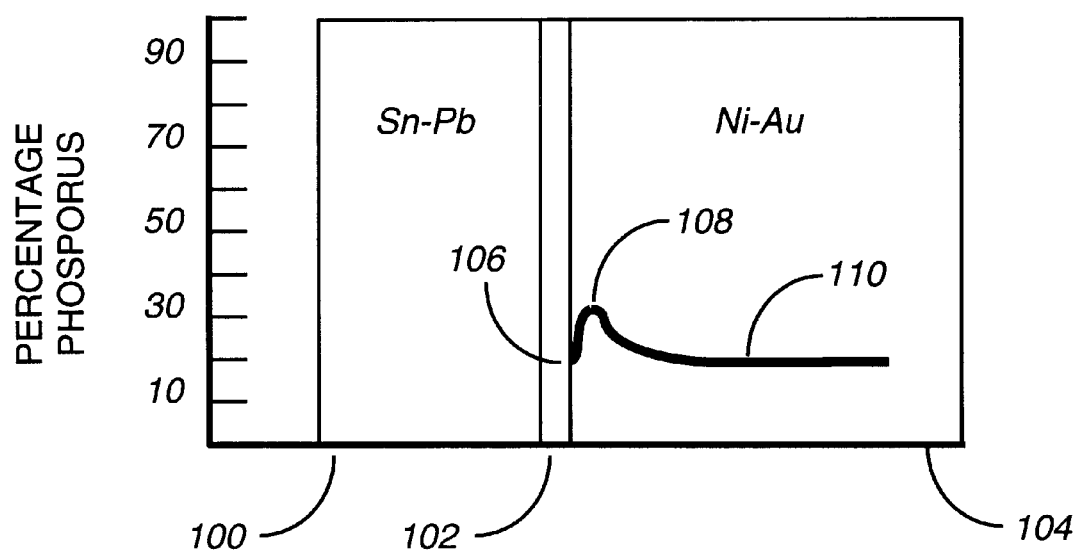
FIG. 4 is a diagram illustrating phosphorus concentration in a solder joint using the conventional soldering process.

Solder joint embrittlement has been traced to the concentration of phosphorus and its distribution within the solder joint. FIG. 4 is a diagram illustrating phosphorus concentration in a solder joint using the conventional reflow soldering process. Following conventional reflow soldering of an electronic component 18 to a nickel-gold secondary finished printed circuit substrate 12, the solder joint comprises a tin-lead fillet 100 which is bonded to the nickel-gold plating 104 by a nickel-tin intermetallic layer located within a reaction zone 102, the gold having been dissolved within the solder fillet 100. The formation of the nickel-tin intermetallic layer rejects the phosphorus from the reaction zone 102. As can been seen in FIG. 4, the phosphorus concentration 106 at the interface between the reaction zone 102 and the nickel-gold plating 104 is essentially that of the phosphorus concentration 110 of phosphorus within the nickel-gold plating 104. As can also be seen, the phosphorus concentration 108 immediately outside the reaction zone 102 increases rapidly to a level almost twice the phosphorus concentration 110. It has been determined that it is the high phosphorus concentration 108 which leads to solder joint embrittlement.

Figure 5:
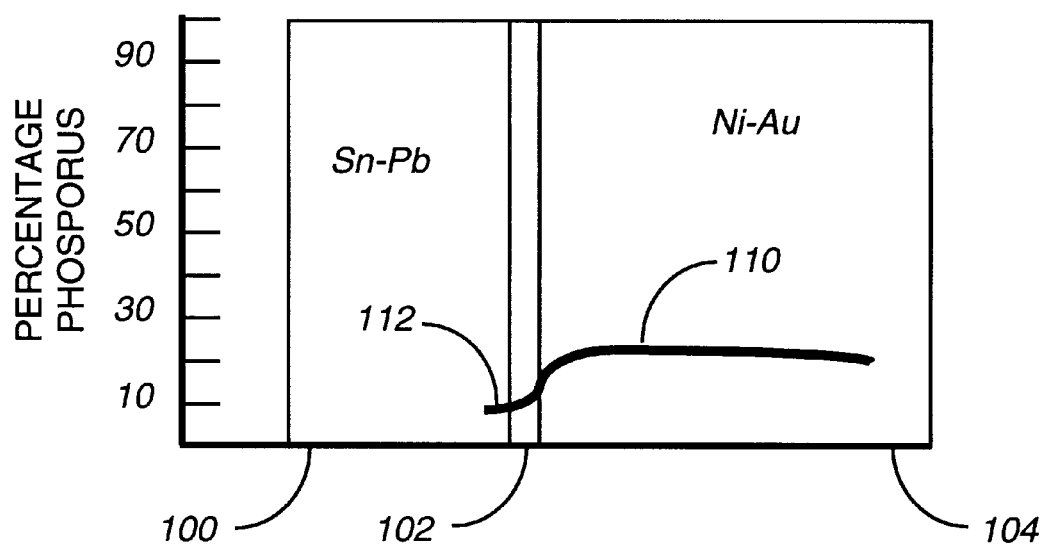
FIG. 5 is a diagram illustrating phosphorus concentration in a solder joint using a solder which includes indium as a constituent for an electronic assembly in accordance with the present invention.

The problem of solder joint embrittlement has been advantageously resolved in the electronic assembly in accordance with the present invention by the application of a solder paste which includes, by way of example, indium as a constituent, such as an indium-tin-lead solder paste which includes approximately 15% indium, wherein the concentration of tin and lead is adjusted to provide a eutectic solder. When indium is introduced into the tin-lead solder paste the phosphorus concentration within the nickel-gold layer 104 is controlled as shown in FIG. 5. When the indium-tin-lead solder paste is utilized in the electronic assembly in accordance with the present invention, the solder joint comprises a tin-lead fillet 100 which is bonded to the nickel-gold plating 104 within a reaction zone 102 which comprises a tin-nickel-indium intermetallic layer, the gold having been dissolved within the solder fillet 100. The formation of the tin-nickel-indium intermetallic layer does not reject the phosphorus from the reaction zone 102. As can been seen in FIG. 5, the phosphorus concentration 112 at the interface between the reaction zone 102 and the nickel-gold plating 104 is essentially that of the phosphorus concentration 110 of phosphorus within the nickel-gold plating 104. The phosphorus concentration 114 rises very little within the nickel-gold layer 104. As can also be seen, phosphorus is no longer excluded from the reaction zone 102, but rather is taken within the reaction zone 102. The phosphorus concentration 112 continues to fall from the phosphorus concentration 110 throughout the reaction zone 102, and also continues to fall within the tin-lead fillet 100. By spreading the phosphorus concentration throughout the reaction zone 102, and by controlling the phosphorus concentration 114 immediately outside the reaction zone 102, solder joint integrity has been found to approach that of conventional tin-lead solder pastes when utilized with a bare copper printed circuit substrate 12. A comparison of joint strength integrity is provided in the Table I below.

TABLE I

| | Pull Strength - pounds | | |
| --- | --- | --- | --- |
| Reflow No. | Sn—Pb Solder | 12% In—Sn—Pb Solder | 25% In—Sn—Pb Solder |
| 1 | 16.13 | 21.36 | 28.70 |
| 3 | 11.91 | 16.26 | 28.64 |

The pull strength achieved for various combinations of printed circuit finish and solder paste with and without indium as a constituent is compared in Table I. Three solder pastes were tested, that of a conventional Tin-Lead solder alloy with 2% Silver content by weight (2% Ag—Sn—Pb); and two Indium-Tin-Lead solder alloys utilized in the electronic assembly in accordance with the present invention: a Tin-Lead solder alloy with 12% Indium content by weight (12% In—Sn—Pb), and a Tin-Lead solder alloy with 25% Indium content by weight (25% In—Sn—Pb). Part of the printed circuit boards tested were placed through the reflow oven once, and a part of the printed circuit boards were placed through the reflow oven a total of three times. As can be seen from Table I, a significant degradation in solder joint strength occurs when a conventional tin-lead solder paste is used to reflow electronic components to a printed circuit pattern having a nickel-gold secondary finish. As also can be seen from Table I, the solder joint integrity is improved relative to the conventional solder reflow process, and almost twice that of a solder joint formed using a conventional tin-lead solder paste with a printed circuit pattern having a nickel-gold secondary finish. It should also be noted that the solder joint integrity does not degrade with the repeated reflow solder step, due at least in part to the improved solder joint ductility imparted by the addition of indium, and to the scavenging of phosphorus in the vicinity of the reaction zone.

Figure 6:
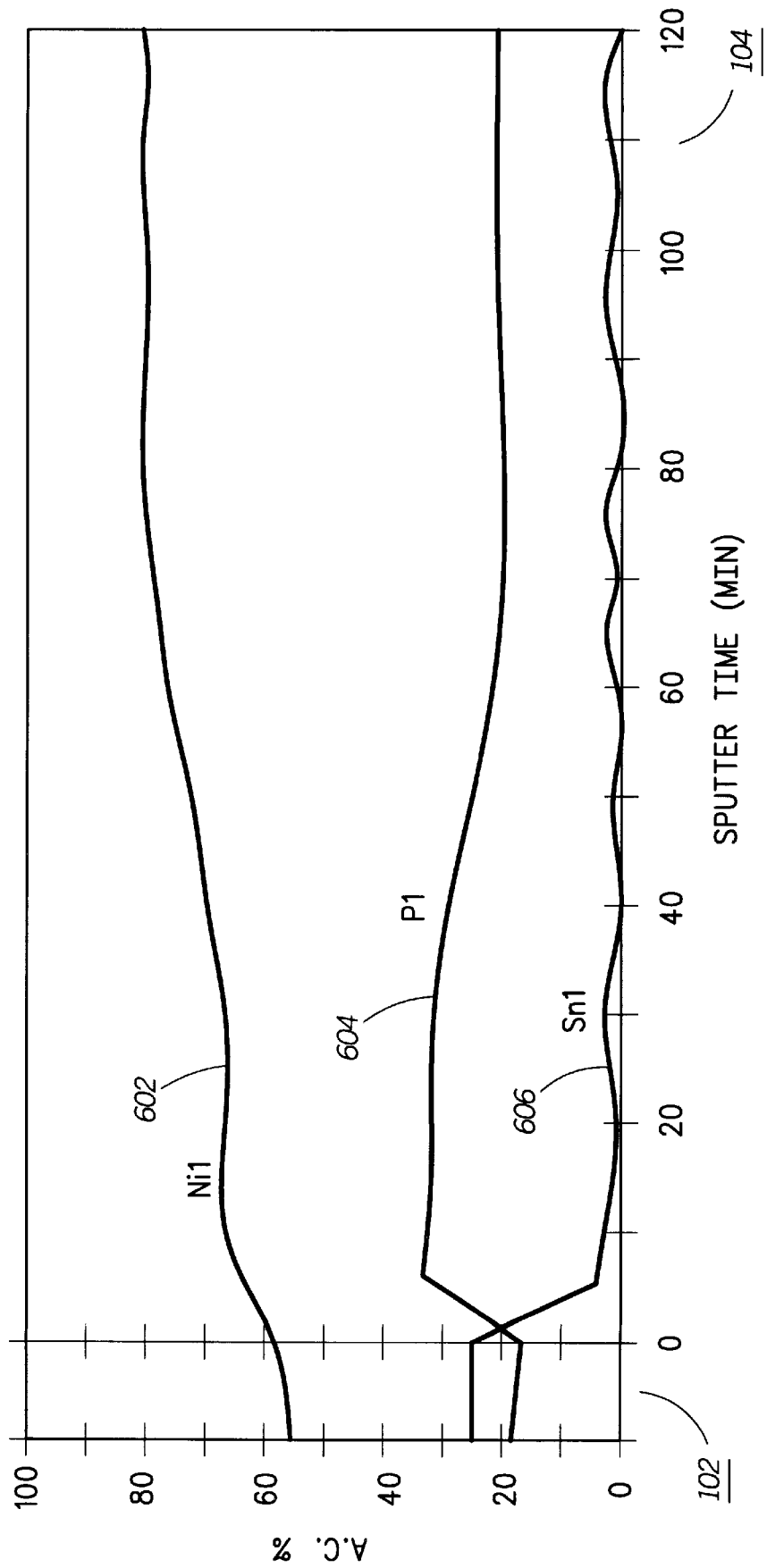
FIG. 6 is a graph illustrating the intermettalic distribution in a solder joint using the conventional soldering process.

FIG. 6 is a depth profile illustrating the metal distribution in a fractured solder joint using the conventional soldering process. The depth profile 600 illustrates the metal distribution within a solder joint which has been reflow soldered using a conventional tin-lead solder and a nickel-gold secondary finished printed circuit board. The depth profile 600 is measured using a Scanning Auger Microprobe manufactured by Physical Electronics of Eden Prairie, Minnesota from the point of break in the solder joint into the nickel-gold plating layer. As illustrated, the break occurred within the intermetallic layer in reaction zone 102. Curve 602 represents the atomic concentration of nickel within the joint, curve 604 represents the atomic concentration of phosphorus within the joint, and curve 606 represents the atomic concentration of tin within the joint. As described above, curve 604 shows the high phosphorus concentration which leads to joint embrittlement.

Figure 7:
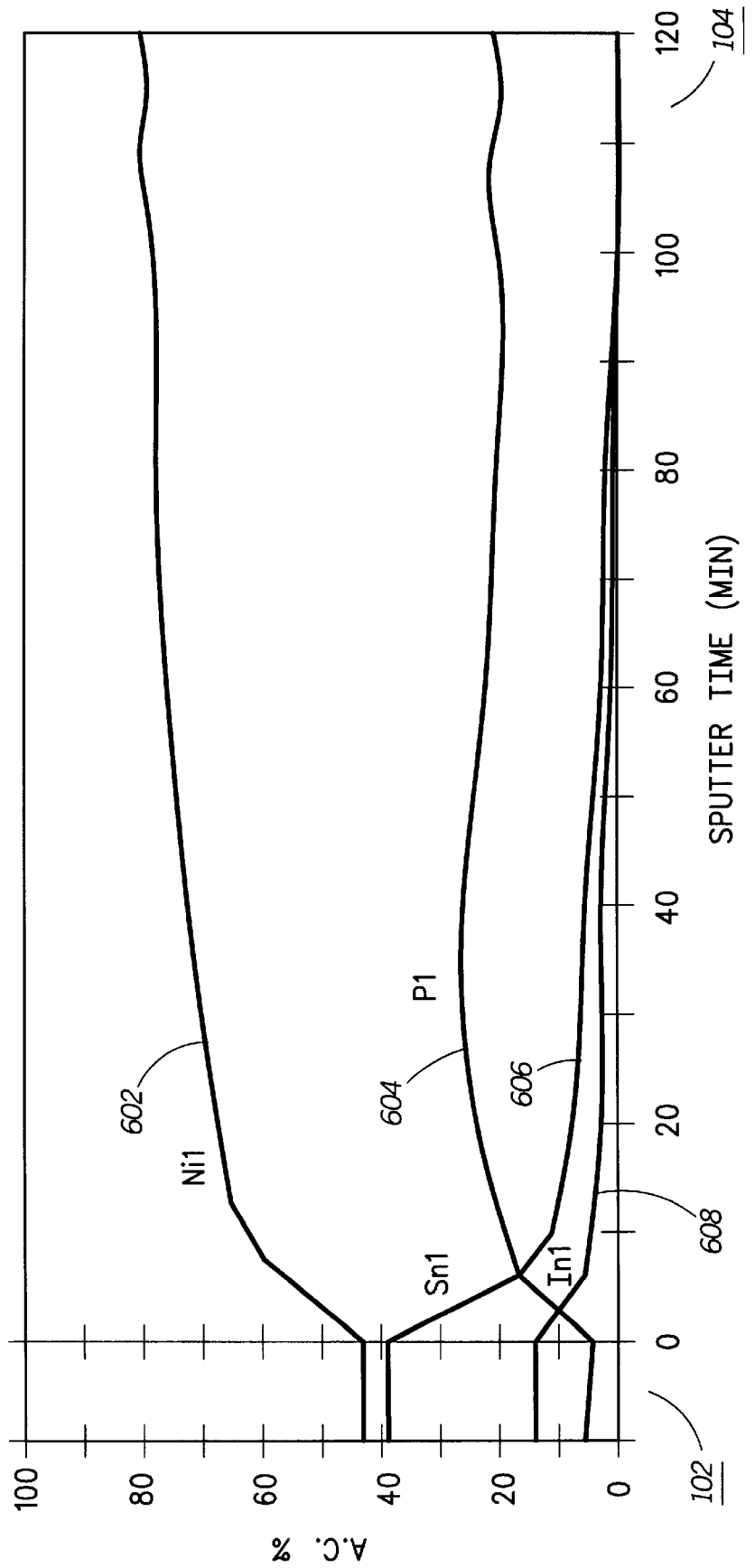
FIGS. 7 and 8 are graphs illustrating the intermettalic distribution in a solder joint using a solder which includes indium as a constituent for an electronic assembly in accordance with the present invention.

FIG. 7 is a depth profile illustrating the metal distribution in a solder joint using an indium-tin-lead solder paste in the electronic assembly in accordance with the present invention. As illustrated, the break also occurred within the intermetallic layer in reaction zone 102. Curve 602 represents the atomic concentration of nickel within the joint, curve 604 represents the atomic concentration of phosphorus within the joint, curve 606 represents the atomic concentration of tin within the joint, and curve 608 represents the atomic concentration of indium within the joint. As described above, curve 604 does not show the high phosphorus concentration which leads to joint embrittlelment, but rather shows that the phosphorus is absorbed into the reaction layer at a very low concentration, as compared to the conventional tin-lead solder joint.

Figure 8:
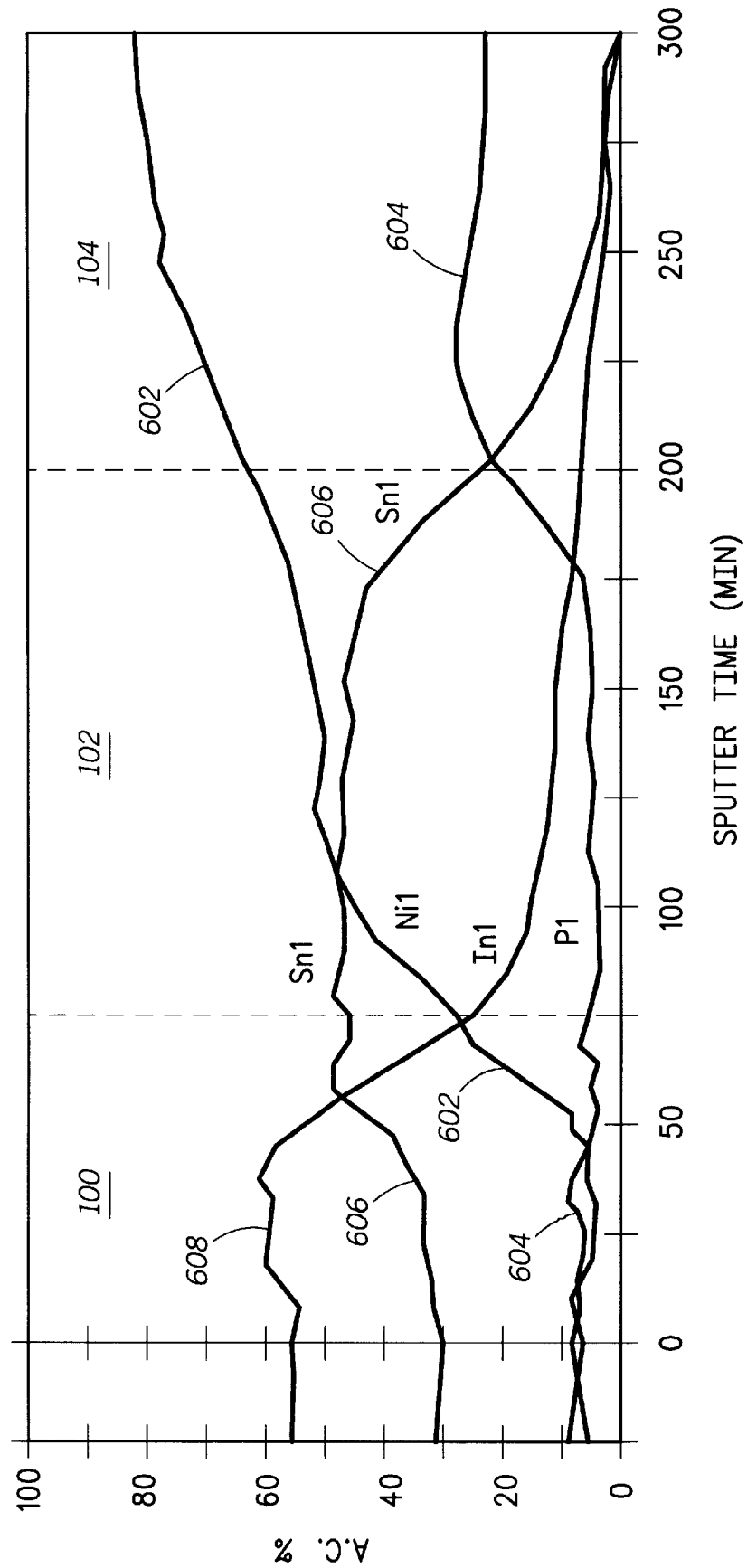

FIG. 8 is a depth profile illustrating the metal distribution in an intact solder joint using an indium-tin-lead solder paste in the electronic assembly in accordance with the present invention. As described above, three identifiable regions are shown, the solder fillet 100., the reaction zone 102, and the nickel-gold plating 104. Within the reflowed solder fillet 100, curve 602 represents the atomic concentration of nickel, and curve 604 represents the atomic concentration of phosphorus within the joint, and it is noted that only small atomic concentrations of nickel and phosphorus enter the solder fillet 100 during the reflow soldering process. Curve 606 represents the atomic concentration of tin, and curve 608 represents the atomic concentration of indium within the solder fillet. (the atomic concentration of lead was purposefully omitted from FIG. 7). Within the reaction zone 102, the atomic concentration of nickel increases significantly, while the atomic concentration of indium decreases significantly. The atomic concentration of phosphorus remains relatively constant. With the inclusion of nickel, a nickel-tin-indium-phosphorus intermetallic is formed within the reaction zone 102.

Within the nickel-gold plating 104, the atomic concentration of phosphorus and nickel increases to essentially the concentrations of phosphorus and nickel within the nickel-gold plating 104. There is no doubling of the phosphorus concentration as observed in a conventional tin-lead solder. The atomic concentration of tin decreases rapidly towards zero within the nickel-gold plating 104, as does the atomic concentration of indium.

In conclusion, the introduction of indium into a tin-lead solder paste used to reflow components to a nickel-gold finish enables the assimilation of phosphorus into the reaction zone, thereby effectively preventing the build-up of phosphorus which leads to joint embrittlement as described above. It will be appreciated that there are other metals, such as zinc, cadmium, and germanium, which would function in a manner similar to indium. Zinc, cadmium, and germanium dissolve completely in a tin-lead solder system and do not form solid components which would melt at a temperature higher than the melting point of eutectic tin-lead solder, as is the case with indium. In addition, zinc, cadmium, and germanium interact with the phosphorus to form compounds which are assimilated into the reaction zone, which would prevent the build-up of phosphorus which leads to joint embrittlement as well.

Figure 9:
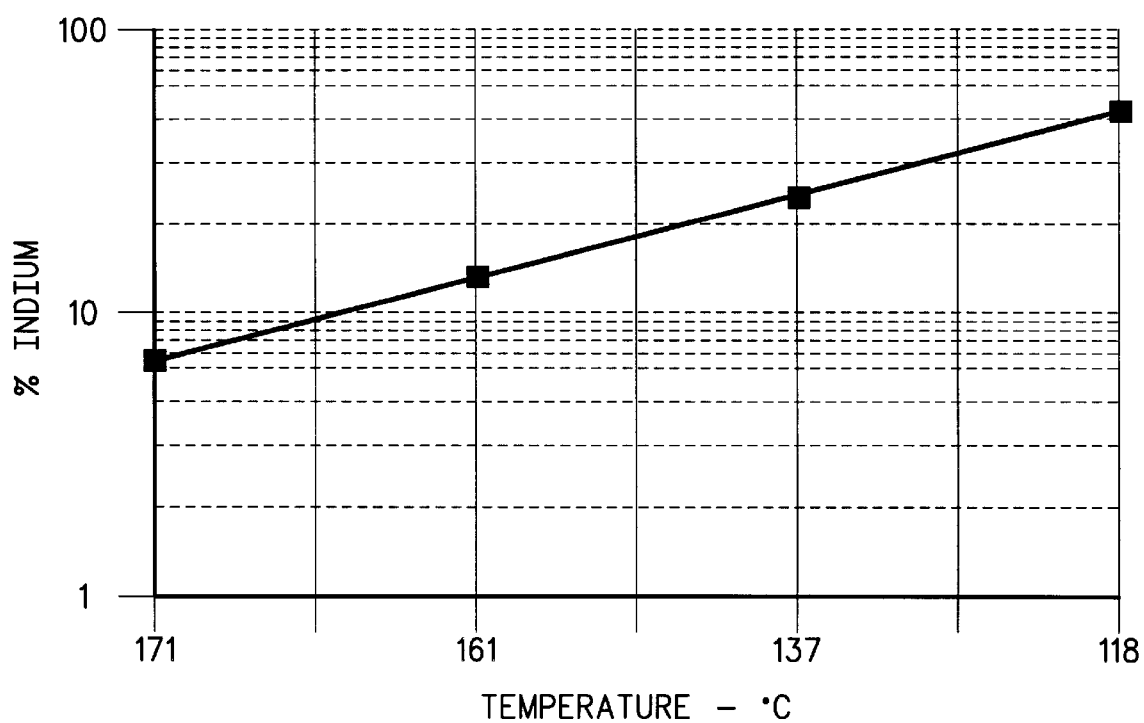
FIG. 9 is a graph showing the melting temperature of a solder alloy as a function of the percentage of indium being incorporated.

It has been further demonstrated from Table I above that indium concentrations as high as 25% will improve solder joint integrity when an electronic component is reflow soldered to a nickel-gold plated printed circuit substrate. An indium concentration as low as 5% can also provide improved solder joint integrity as compared to a conventional tin-lead solder paste when an electronic component is reflow soldered to a nickel-gold plated printed circuit substrate. When indium is introduced into a solder, such as a tin-lead solder paste, an added advantage is obtained, that of reduction of the melting point of the solder paste. A conventional tin-lead solder paste melts at 183° C., whereas, as shown in FIG. 9, which is a graph showing the melting temperature of a solder paste as a function of the percentage of indium incorporated, an indium-tin-lead solder paste having a 15% indium concentration melts at 161° C. It will be appreciated that for any concentration of indium added to the tin-lead solder paste, the concentration of tin and lead is adjusted to produce a eutectic solder. Not only is the solder joint integrity improved significantly when a nickel-gold secondary coated printed circuit substrate is used, but also components which cannot tolerate the high reflow solder temperatures encountered when using a conventional tin-lead solder paste, can now be successfully reflow soldered at the lower reflow solder temperature. required. At indium concentrations much higher than 25%–30%, the cost of the solder starts to become prohibitive except for very special applications, and the ductility of the solder becomes too high for many applications. It will be appreciated that the use of a solder paste which includes indium as a constituent in an electronic assembly in accordance with the present invention would provide improved joint integrity when the terminations of the electronic components have a secondary nickel-gold finish when used with a printed circuit substrate having printed circuit traces which have a nickel-gold secondary finish, or when the printed circuit traces utilizes only an organic solder preservative. While the electronic assembly in accordance with the present invention is described primarily in terms of a reflow solder process, it will be appreciated that the electronic assembly in accordance with the present invention would also provide improved solder joint integrity for leaded components using either a wave soldering process or a hand soldering process utilizing an indium-tin-lead solder as well.

Figure 10:
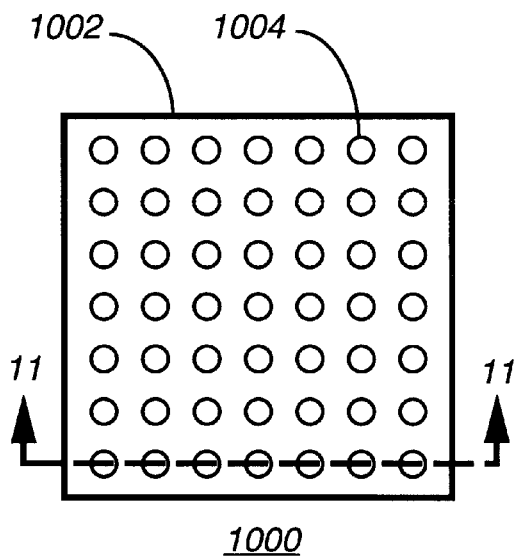
FIG. 10 is a bottom plan view of a ball grid array semiconductor device.
Figure 11:
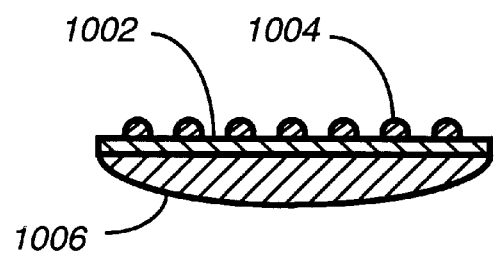
FIG. 11 is a cross-sectional view of the ball grid array semiconductor device of FIG. 10.

FIG. 10 is a bottom view and FIG. 11 is a cross-sectional view 11—11 of a ball grid array (BGA) 1000 semiconductor device. The BGA array 1000 comprises a substrate 1002 upon which solder paste is reflowed onto contact pads to form solder bumps 1004. The solder bumps provide electrical connection to an integrated circuit die (not shown) which has been assembled to the opposite side of the substrate 1002. The integrated circuit die is typically covered with a die cap or conformal coating 1006 which protects the integrated circuit. In accordance with the present invention, the solder bumps 1004 of the BGA array 1000 can be processed with a secondary nickel-gold finish, and as such would benefit from the use of a solder paste which includes indium as a constituent in an electronic assembly in accordance with the present invention.

Figure 12:
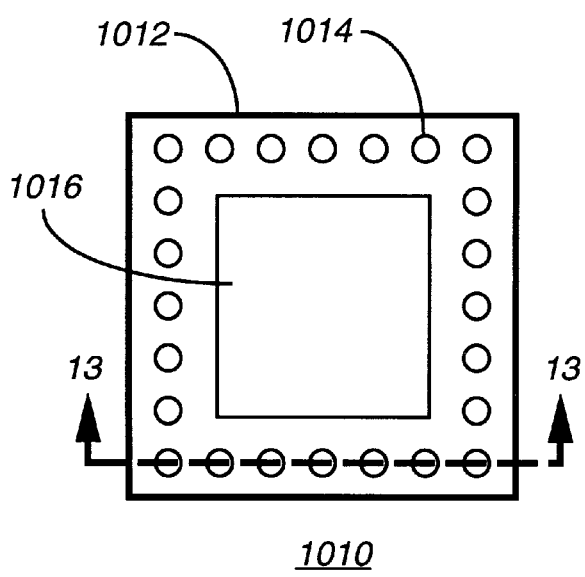
FIG. 12 is a bottom plan view of a ball grid array semiconductor device.
Figure 13:
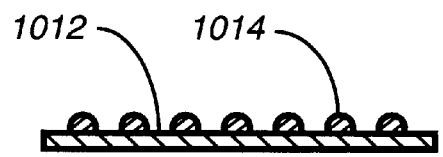
FIG. 13 is a cross-sectional view of the ball grid array semiconductor device of FIG. 12.

FIG. 12 is a top view and FIG. 11 is a cross-sectional view 13—13 of a flip-chip integrated circuit 1010 semiconductor device. The flip-chip integrated circuit 1010 comprises a semiconductor die 1012 having an active area 1016 and bonding pads upon which solder paste is reflowed to form solder bumps 1014. The solder bumps provide electrical connection to the flip-chip integrated circuit 1010. In accordance with the present invention, the solder bumps 1014 of the flip-chip integrated circuit 1010 can be processed with a secondary nickel-gold finish, which when soldered to a printed circuit substrate would benefit from the use of a solder paste which includes indium as a constituent in an electronic assembly in accordance with the present invention. Flip-chip integrated circuits are often reflow soldered to a flexible substrate, such as a polyimide film, which has been processed with a secondary nickel-gold finish The solder joint integrity would benefit from the use of a solder paste which includes indium as a constituent in an electronic assembly in accordance with the present invention The electronic assembly in accordance with the present invention utilizes a solder paste which includes indium as a constituent to solder electronic components and semiconductor devices to nickel-gold plated printed circuit substrates. Electronic assemblies which utilize nickel-gold plating include such electronic devices as a pager, cellular telephone, cordless telephone, or personal digital assistants (PDAs), and have improved solder joint integrity when a solder paste which includes indium as a constituent is used as compared to that derived with the use of standard tin-lead solders. The solder paste which includes indium as a constituent also allows lower reflow solder temperatures, thereby enabling a greater number of electronic components to be reflowed as compared to a conventional reflow solder process. The electronic assembly in accordance with the present invention can utilize printed circuit substrates which have a secondary nickel-gold finish applied or electronic components which have a secondary nickel-gold finish applied. The electronic assembly in accordance with the present invention can also utilize semiconductor devices which have a secondary nickel-gold finish applied. When utilized with semiconductor devices, the semiconductor devices can be packaged, such as BGA arrays or SLIC (single in-line integrated circuits), DIP (dual in-line integrated circuits) or other packaged integrated circuits, or unpackaged, such as flip-chip integrated circuits.

We claim:

1. An electronic assembly, comprising:
   one or more electronic components having solder terminations;
   a printed circuit substrate having copper printed circuit traces,
   wherein at least one of said solder terminations of said one or more electronic components and said copper printed circuit traces of said printed circuit substrate is plated with a secondary finish comprising a first electrolessly deposited nickel film plating layer containing phosphorus and a second plated gold layer; and
   a solder joint joining said one or more electronic components to said copper printed circuit traces on said printed circuit substrate, said solder joint formed using a solder comprising indium-tin-lead, wherein said solder provides improved solder joint integrity with the secondary finish.

2. The electronic assembly according to claim 1, wherein said one or more electronic components are leadless and soldered to said copper printed circuit traces using a reflow soldering process.

3. The electronic assembly according to claim 1, wherein said one or more electronic components has leads and are soldered to said copper printed circuit traces using a wave soldering process.

4. The electronic assembly according to claim 1, wherein said secondary finish prevents oxidation of said solder terminations of said one or more electronic components and said copper printed circuit traces on the printed circuit substrate.

5. The electronic assembly according to claim 1, wherein said solder is an indium-tin-lead solder which contains 15% indium by weight.

6. The electronic assembly according to claim 5, wherein said indium-tin-lead solder is a eutectic solder.

7. The electronic assembly according to claim 1, wherein said printed circuit substrate is a flexible substrate.

8. The electronic assembly according to claim 1, wherein the electronic assembly is a pager.

9. The electronic assembly according to claim 1, wherein the electronic assembly is a cellular telephone.

10. An electronic assembly, comprising:
    a semiconductor device having solder terminations;
    a printed circuit substrate having copper printed circuit traces,
    wherein at least one of said solder terminations of said semiconductor device and said copper printed circuit traces of said printed circuit substrate is plated with a secondary finish comprising a first electrolessly deposited nickel film layer containing phosphorus and a second plated gold layer; and
    a solder joint joining said one or more electronic components to said copper printed circuit traces on said printed circuit substrate, said solder joint formed using a solder comprising indium-tin-lead, wherein said solder provides improved solder joint integrity with the secondary finish.

11. The electronic assembly according to claim 10, wherein said semiconductor device is a ball grid array.

12. The electronic assembly according to claim 10, wherein said semiconductor device is a flip-chip integrated circuit.

13. The electronic assembly according to claim 10, wherein said one or more electronic components are leadless and soldered to said copper printed circuit traces using a reflow soldering process.

14. The electronic assembly according to claim 10, wherein said one or more electronic components have leads and are soldered to said copper printed circuit traces using a wave soldering process.

15. The electronic assembly according to claim 10, wherein said secondary finish prevents oxidation of said solder terminations of said one or more electronic components and said copper printed circuit traces on the printed circuit substrate.

16. The electronic assembly according to claim 10, wherein said solder is an indium-tin-lead solder which contains 15% indium by weight.

17. The electronic assembly according to claim 16, wherein said indium-tin-lead solder is a eutectic solder.

18. The electronic assembly according to claim 10, wherein said printed circuit substrate is a flexible substrate.

19. The electronic assembly according to claim 10, wherein the electronic assembly is a pager.

20. An electronic assembly, comprising:
one or more electronic components having solder terminations;
a printed circuit substrate having copper printed circuit traces,
wherein at least one of said solder terminations of said one or more electronic components and said copper printed circuit traces of said printed circuit substrate is plated with a secondary finish comprising a first electrolessly deposited nickel film plating layer containing phosphorus and a second plated gold layer; and
a solder joint joining said one or more electronic components to said copper printed circuit traces on said printed circuit substrate, said solder joint formed using a solder comprising tin-lead and a third solder constituent selected from a group of solder constituents including zinc, cadmium, and germanium, wherein said solder provides improved solder joint integrity with the secondary finish.

21. An electronic assembly, comprising:
one or more electronic components having solder terminations;
a flexible printed circuit substrate having copper printed circuit traces,
wherein at least one of said solder terminations of said one or more electronic components and said copper printed circuit traces of said flexible printed circuit substrate is plated with a secondary finish comprising a first electrolessly deposited nickel film plating layer containing phosphorus and a second plated gold layer; and
a solder joint joining said one or more electronic components to said copper printed circuit traces on said flexible printed circuit substrate, said solder joint formed using a solder comprising indium-tin-lead, wherein said solder provides improved solder joint integrity with the secondary finish.

22. An electronic assembly, comprising:
a semiconductor device having solder terminations;
a flexible printed circuit substrate having copper printed circuit traces,
wherein at least one of said solder terminations of said semiconductor device and said copper printed circuit traces of said flexible printed circuit substrate is plated with a secondary finish comprising a first electrolessly deposited nickel film plating layer containing phosphorus and a second plated gold layer; and
a solder joint joining said one or more electronic components to said copper printed circuit traces on said flexible printed circuit substrate, said solder joint formed using a solder comprising indium-tin-lead, wherein said solder provides improved solder joint integrity with the secondary finish.

23. An electronic assembly, comprising:
one or more electronic components having solder terminations;
a flexible printed circuit substrate having copper printed circuit traces,
wherein at least one of said solder terminations of said one or more electronic components and said copper printed circuit traces of said flexible printed circuit substrate is plated with a secondary finish comprising a first electrolessly deposited nickel film plating layer containing phosphorus and a second plated gold layer; and
a solder joint joining said one or more electronic components to said copper printed circuit traces on said flexible printed circuit substrate, said solder joint formed using a solder comprising tin-lead and a third solder constituent selected from a group of solder constituents including indium, zinc, cadmium, and germanium, wherein said solder provides improved solder joint integrity with the secondary finish.

* * * * *